(12) United States Patent
Jian et al.

(10) Patent No.: US 7,955,701 B2
(45) Date of Patent: Jun. 7, 2011

(54) PREPREG AND RESIN FOR PREPARING THE SAME

(75) Inventors: Bin Jian, Taoyuan (TW); Lai-Tu Liu, Taoyuan (TW)

(73) Assignee: ITEQ Corporation, Taoyuan (TW)

( * ) Notice: Subject to any disclaimer, the term of this patent is extended or adjusted under 35 U.S.C. 154(b) by 0 days.

(21) Appl. No.: 12/487,661

(22) Filed: Jun. 19, 2009

(65) Prior Publication Data

US 2010/0159765 A1    Jun. 24, 2010

(30) Foreign Application Priority Data

Dec. 22, 2008  (TW) .............................. 97150102 A

(51) Int. Cl.
  *B32B 27/04* (2006.01)
  *B32B 27/06* (2006.01)
  *B32B 27/36* (2006.01)
  *B32B 27/38* (2006.01)
  *B32B 27/40* (2006.01)
  *C08L 63/02* (2006.01)
  *C08L 75/06* (2006.01)

(52) U.S. Cl. ..................... 428/415; 428/297.4; 428/414; 428/416; 428/423.1; 428/480; 428/901; 523/400; 525/438; 525/453; 525/528; 525/533

(58) Field of Classification Search ........................ None
See application file for complete search history.

(56) References Cited

U.S. PATENT DOCUMENTS

| 5,545,697 | A | 8/1996 | Uchida |
| 6,194,523 | B1 * | 2/2001 | Murata et al. ................ 525/438 |
| 6,670,006 | B1 | 12/2003 | Sugimori et al. |
| 2008/0113184 | A1 * | 5/2008 | Yoshida et al. ............... 428/332 |

FOREIGN PATENT DOCUMENTS

| EP | 0432923 A1 * | 6/1991 |
| JP | 2007-051211 A * | 3/2007 |

OTHER PUBLICATIONS

Machine translation of JP 2007-051211 A, provided by the JPO website (no date).*

* cited by examiner

*Primary Examiner* — Michael J Feely
(74) *Attorney, Agent, or Firm* — CKC & Partners Co., Ltd.

(57) ABSTRACT

A composition for preparing a resin is provided. The composition includes a brominated epoxy resin, a urethane-modified copolyester, a curing agent and a solvent. A prepreg is also provided. The prepreg includes a glass fabric and a resin layer on the glass fabric. The resin layer is made from the foregoing resin.

16 Claims, No Drawings

PREPREG AND RESIN FOR PREPARING THE SAME

RELATED APPLICATIONS

This application claims priority to Taiwan Application Serial Number 97150102, filed Dec. 22, 2008, which is herein incorporated by reference.

BACKGROUND

1. Technical Field

The present disclosure relates to a prepreg and a resin for preparing the same. More particularly, the present invention relates to a prepreg for adhering multi-layer circuit boards and a resin for preparing the same.

2. Description of Related Art

Technology continues to progress and this has resulted in circuit boards becoming increasingly complex. Circuit board structures are more complex because on increased design specifications, technology developments, or different applications of electronic products. The complicated structure of the circuit board, such as multi-layer circuit board, is often used in a printer head, a foldable mobile phone or a portable computer. Usually, the multi-layer circuit board is formed by overlapping several substrates with different features forms.

The substrate for the circuit board is divided into flexible substrate and rigid substrate. The flexible substrate is made from polyimide (PI), poly(ethylene terephthalate) (PET), poly(ethylene 2,6-naphthalate) (PEN) or a material containing rubber resin. The rigid substrate is made from epoxy resin.

Because the material of the flexible substrate and the rigid substrate is different, the prepreg is used to join the two substrates by thermocompression. However, during the thermocompression process, the resin of the prepreg often overflows from the edges of the two substrates and even more serious for manufacturing the circuit boards of the smaller electronic products. Hence, the reliability of the circuit boards is decreased. According to the standard of the Institute for Interconnecting and Packing Electronic Circuits (IPC), IPC-6013 3.3.1.3, the resin overflow from the edges of the substrates should be smaller than 1.5 mm (millimeter) to meet the reliability and manufacturing requirements.

SUMMARY

A composition for preparing a resin is provided. The composition includes a brominated epoxy, a urethane-modified copolyester, a curing agent and a solvent. The brominated epoxy is 100 parts by weight, the urethane-modified copolyester is from 5 to 15 parts by weight, the curing agent is from 2.5 to 45 parts by weight, and the solvent is from 40 to 70 parts by weight.

A prepreg is provided. The prepreg includes a fiberglass cloth and a resin layer on the fiberglass cloth. The resin layer is made from a resin, and the resin is prepared by a composition including a brominated epoxy, a urethane-modified copolyester, a curing agent and a solvent. The brominated epoxy is 100 parts by weight, the urethane-modified copolyester is from 5 to 15 parts by weight, the curing agent is from 2.5 to 45 parts by weight, and the solvent is from 40 to 70 parts by weight.

A printed circuit board is provided. The printed circuit board includes a first substrate, a second substrate and a prepreg between the first substrate and the second substrate for adhering the first substrate and the second substrate. The prepreg includes a fiberglass cloth and a resin layer on the fiberglass cloth. The resin layer is made from a resin, and the resin is prepared by a composition including a brominated epoxy, a urethane-modified co-polyester, a curing agent and a solvent. The brominated epoxy is 100 parts by weight, the urethane-modified co-polyester is from 5 to 15 parts by weight, the curing agent is from 2.5 to 45 parts by weight, and the solvent is from 40 to 70 parts by weight.

DETAILED DESCRIPTION

An epoxy prepreg is used as an adhesive interface between a flexible substrate and a rigid substrate. In order to decrease the resin overflow from is the substrate edge, a rubber-containing epoxy or a rubber-modified epoxy is added into a major epoxy, which is not modified by rubber. The weight ratio of the rubber-containing epoxy or the rubber-modified epoxy to the major epoxy should be larger than 0.3 for changing the mobility of the major epoxy to decrease the resin overflow from the substrate edges. However, since the ratio described above is greater than 0.3, the thermal stability and the thermal expansion property of the epoxy prepreg is changed. Therefore, the flexible substrate and the rigid substrate are easily deformed during thermocompression process.

Furthermore, the polarity of the solvent used in the rubber-containing epoxy or the rubber-modified epoxy is different from the polarity of the solvent used in the major epoxy. Therefore, it is difficult to mix the rubber-containing epoxy or the rubber-modified epoxy with the major epoxy. In other words, the rubber-containing epoxy or the rubber-modified epoxy must be diluted by a lot of the solvent used in the major epoxy to be able to be mixed with the major epoxy.

In some other cases, urethane is used to be the adhesive interface between flexible printed circuit boards. The urethane also is used to make the flexible substrate of a printed circuit boards. The urethane resin has high viscosity and can be directly coated on the flexible substrate. However, it is hard to reduce the viscosity of the urethane resin. Therefore, it is not suitable to use the urethane resin alone to prepare the prepreg unless epoxy is added into the urethane resin. Nevertheless, the polarity difference between urethane and epoxy is great. Thus, if the solvent used in epoxy is used to mix urethane and epoxy, a huge amount of solvent is needed. The process is complicated and high cost.

Accordingly, a composition for preparing a resin is provided in an embodiment of the present invention. The resin is used in the impregnated process to make a prepreg. The composition includes a brominated epoxy, a urethane-modified copolyester, a curing agent and a solvent.

The brominated epoxy is the major component in the composition and is the major reactant for the polymerization reaction and the curing reaction. The brominated epoxy is formed by a catalyzed reaction of a tetrabromobisphenol A reacted with an epoxy at a high temperature. The chemical formula of the brominated epoxy is shown below.

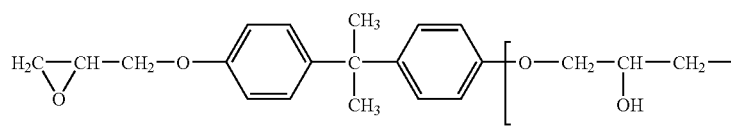
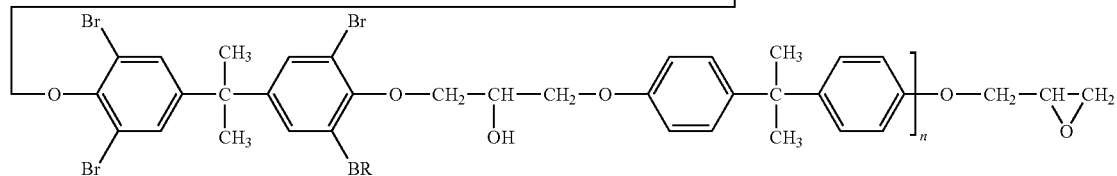

The brominated epoxy can increase the glass transition temperature, the burning resistance and the heat resistance of the resin, so that the resin can be used to make a prepreg for adhering the circuit boards under high temperature. The brominated epoxy is XU-19047 from Dow Chemical Company, and the resin component in XU-19047 is 70 wt %, for example.

The urethane-modified copolyester is added for controlling the resin overflow, and the polarity of the urethane-modified copolyester is similar to the polarity of the epoxy. Since the polarity of the urethane-modified copolyester is similar to that of the epoxy, the urethane-modified copolyester can be mixed with the major epoxy without adding a great amount of solvent. Furthermore, since the expansion coefficient of the resin after adding the urethane-modified copolyester is similar to that of the substrates, the substrates are not deformed during the thermocompression process. According to an embodiment, 5 to 15 parts by weight of the urethane-modified copolyester is added into per 100 parts by weight of the major component. For example, the urethane-modified copolyester is UR3500 of TOYOBO CO., LTD; the molecular weight of the copolyester is more than 10000, and the average molecular weight of the copolyester is 15000. The resin component in UR3500 is 40 wt %.

The curing agent above is used to polymerize the brominated epoxy. The curing agent can be a novolac curing agent, a dicyandiamide or a combination thereof, for example. From 25 to 45 parts by weight of the novolac curing agent is added into per 100 parts by weight of the major component. Alternatively, from 2.5 to 4.0 parts by weight of the dicyandiamide is added into per 100 parts by weight of the major component.

All components in the composition for preparing a resin described above are dispersed in a common solvent to mix together. The solvent is cyclohexanone, propylene-glycol methyl-ether acetate (PMA), propylene-glycol methyl-ether (PM), or a combination thereof. From 40 to 70 parts by weight of the solvent is added into per 100 parts by weight of the major component.

In addition to the brominated epoxy being the major component of the composition, an epoxy having four functional groups or an epoxy containing high bromine content may also be added into the composition. The brominated epoxy mixed with the epoxy having four functional groups can increase the glass transition temperature of the resin and make the resin has ultraviolet resistance. The chemical formula of the epoxy having four functional groups is shown below.

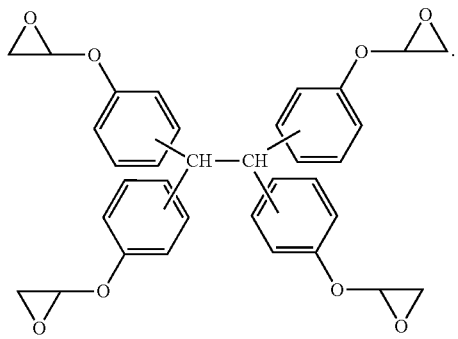

The epoxy having four functional groups is TNE 190A70 from Chang Chun Plastics Co., LTD, and the resin component in the TNE 190A70 is 70 wt %, for example.

The brominated epoxy mixed with the epoxy containing high bromine content can increase the heat resistance of the resin. The epoxy containing high bromine content is tetrabromobisphenol A diglycidyl ether or BEB 400T60 from Chang Chun Plastics Co., LTD, for example, and the resin component in the BEB 400T60 is 70 wt %.

In an embodiment, the composition also includes a trace amount of catalyst to catalyze the polymerization reaction of epoxy during the curing reaction to shorten the curing time of the resin. The catalyst is 2-methylimidazole, for example.

According to an example of the present invention, 100 parts by weight of the brominated epoxy is mixed with 4.7 parts by weight of the epoxy having four functional groups and 16 parts by weight of the epoxy containing high bromine content to be a major component in the composition. The brominated epoxy is XU-19074 from Dow Chemical Company, and the resin component in the XU-19074 is 70 wt %. The epoxy resin having four functional groups is TNE 190A70 from Chang Chun Plastics Co., LTD, and the resin component in TNE 190A70 is 70 wt %. And the epoxy containing high bromine content is BEB 400T60 from Chang Chun Plastics Co., LTD, and the resin component is in BEB 400T60 70 wt %.

Next, 100 parts by weight of the major component is mixed with 11.4 parts by weight of the urethane-modified copolyester (UR3500 of TOYOBO CO., LTD, the molecular weight is more than 10000, and the average molecular weight is 15000. The resin component in UR3500 is 40 wt %.), 31.5 parts by weight of the novolac curing agent, 0.11 parts by weight of the 2-methylimidazole, and 62 parts by weight of the cyclohexanone. The all components described above are stirred for 180 minutes by a stirring apparatus at room temperature to form a resin. The resin is used in the impregnated process to make a prepreg.

A prepreg includes a fiberglass cloth and a resin layer on the fiberglass cloth. The resin layer is made from the resin described above. The fiberglass cloth is impregnated with the resin by a roller impregnating machine. And then the fiberglass impregnated with the resin is heated and dried at 150~200° C. to form a prepreg. The thickness of the fiberglass cloth is 0.04-0.06 mm, and the weight of the fiberglass cloth is 46-50 gram per square meter.

The various properties of the prepreg are tested according to the IPC-TM-650, a standard of the Institute for Interconnecting and Packing Electronic Circuits. The various properties include resin overflow, the heat resistance and the electronic insulation of the prepreg. The test results are shown in Table 1.

TABLE 1

| Characters | Measurement values | Test method (IPC-TM-650) |
| --- | --- | --- |
| Resin Content | 63% | 2.3.16.1 |
| Resin Flow | <2% | 2.3.17 |
| Circular Flow | <20 mil | 2.3.17.2 |
| Glass Transition Temperature | 165° C. | 2.4.25C |
| Decomposition Temperature | 328° C. | 2.4.24.6 |
| Time to Delamination (T-288) | 10.5 min | 2.4.24.1 |
| Solder Float at 288° C. | >10 min | 2.4.13 |
| Dielectric Constant at 10 MHz | 3.94 | 2.5.5 |
| Dielectric Loss Factor at 10 M Hz | 0.025 | 2.5.5 |

As shown in Table 1, the resin content is tested according to the IPC-TM 650 2.3.16.1, and the resin content of the prepreg is 63%. The resin flow and the circular flow indicate the resin flow phenomenon after the substrates are thermocompressed, and the lower value indicates the less resin overflow from the edges of the thermocompressed substrates. The resin flow and the circular flow of the prepreg are tested by the IPC-TM 650 2.3.17. The resin flow is less than 2% and the circular flow is less than 20 mil (1 mil=0.0254 mm).

Glass transition temperature (Tg), decomposition temperature (Td), time to delamination and solder float at 288° C. indicate the heat resistance of the prepreg. The higher temperature of Tg and Td and the longer delamination time and solder float at 288° C. indicate the better heat resistance and the better burning resistance of the prepreg. The Tg of the prepreg is 165° C. determined by the differential scanning calorimetry (DSC) according to the IPC-TM-650 2.4.25C. The Td of the prepreg is 328° C. determined by the thermal gravimetric analysis (TGA) according to the IPC-TM-650 2.4.24.6. Further, the delamination time of the prepreg at 288° C. is 10.5 minutes, which is determined by the thermo-mechanical analysis (TMA) according to the IPC-TM-650 2.4.24.1. The time of the solder float at 288° C. of the prepreg at 288° C. is longer than 10 minutes, which is determined according to the IPC-TM-650 2.4.13.

The dielectric constant indicates the insulation of the prepreg, and the lower value indicates the better insulation of the prepreg. And the dielectric loss factor indicates the absorption of a certain range of a microwave by a material under a certain temperature. In the standard of the communicational products, the lower value of the dielectric loss factor is better. The dielectric constant of the prepreg is 3.94, and the dielectric loss factor of the halogen-free prepreg is 0.025. Both determined according to the IPC-TM-650 2.5.5.

According to the results of Table 1, the prepreg is burning resistance and heat resistance. The resin overflow of the prepreg is less than 20 mil during the thermocompression process of the flexible and the rigid substrates. Therefore, the prepreg meets the standard of the IPC.

In addition, the prepreg is thermocompressed with a 1 oz copper or a 1 oz brown oxide copper to test the adhesion strength of the prepreg according to the IPC-TM-650 2.4.8. The adhesion strength of the prepreg with the 1 oz copper is 10.0 pound/inch (lb/in), and the adhesion strength of the bonding with the 1 oz brown oxide copper is 5.3 lb/in.

The foregoing prepreg is used for adhering the substrates of the circuit boards. Another embodiment of the present invention provides a printed circuit board, which includes a first substrate, a second substrate and a prepreg between the first substrate and the second substrate. The prepreg is used to be an interface for adhering the first substrate and the second substrate. The first substrate is a flexible substrate or a rigid substrate. And the second substrate is also a flexible substrate or a rigid substrate.

What is claimed is:

1. A composition for preparing a resin comprising:
   100 parts by weight of a brominated epoxy, wherein the brominated epoxy is a catalyzed reaction product of tetrabromobisphenol-A and bisphenol-A diglycidyl ether, and wherein said 100 parts by weight is greater than each amount of the remaining components in the composition;
   from 5 to 15 parts by weight of a urethane-modified copolyester;
   from 2.5 to 45 parts by weight of a curing agent; and
   from 40 to 70 parts by weight of a solvent.

2. The composition of claim 1, further comprising an epoxy having four epoxy groups.

3. The composition of claim 2, wherein the epoxy having four epoxy groups is present in an amount of 4.7 parts by weight.

4. The composition of claim 1, further comprising tetrabromobisphenol A diglycidyl ether.

5. The composition of claim 4, wherein the tetrabromobisphenol A diglycidyl ether is present in an amount of 16 parts by weight.

6. The composition of claim 1, wherein the urethane-modified copolyester is present in an amount of 11.4 parts by weight.

7. The composition of claim 1, wherein the curing agent is selected from the group consisting of novolac curing agent, dicyandiamide and a combination thereof.

8. The composition of claim 7, wherein the novolac curing agent is present in an amount of 31.5 parts by weight.

9. The composition of claim 1, wherein the solvent is selected from the group consisting of cyclohexanone, propylene-glycol methyl-ether acetate, propylene-glycol methyl-ether and a combination thereof.

10. The composition of claim 1, wherein the solvent is present in an amount of 62 parts by weight.

11. The composition of claim 1, further comprising a catalyst for catalyzing a polymerization reaction of epoxy resin.

12. The composition of claim 11, wherein the catalyst is 2-methylimidazole.

13. A prepreg, comprising:
   a fiberglass cloth; and
   a resin layer on the fiberglass cloth;
   wherein the resin layer is made from a resin prepared by the composition of claim 1.

14. A printed circuit board, comprising:
   a first substrate;
   a second substrate; and
   a prepreg between the first substrate and the second substrate for adhering the first substrate and the second substrate;
   wherein the prepreg is the prepreg of claim 13.

15. The printed circuit board of claim 14, wherein the first substrate is a flexible substrate or a rigid substrate.

16. The printed circuit board of claim 14, wherein the second substrate is a flexible substrate or a rigid substrate.

* * * * *